United States Patent [19]

Puri et al.

[11] Patent Number: 5,164,678
[45] Date of Patent: Nov. 17, 1992

[54] PROCESS FOR COMPENSATING NONLINEARITIES IN AN AMPLIFIER CIRCUIT

[75] Inventors: Narindra N. Puri, Manmouth JC., N.J.; Hans Ulrich Boksberger, Oberbözberg, Switzerland

[73] Assignee: Asea Brown Boveri Ltd, Baden, Switzerland

[21] Appl. No.: 728,733

[22] Filed: Jul. 11, 1991

[30] Foreign Application Priority Data

Jul. 12, 1990 [EP]  European Pat. Off. ......... 90113326.4

[51] Int. Cl.$^5$ .............................................. H03F 1/32
[52] U.S. Cl. .................................... 330/149; 328/163; 455/63
[58] Field of Search ................ 330/149, 151; 328/163; 455/50, 63, 295

[56] References Cited

U.S. PATENT DOCUMENTS

| | | | |
|---|---|---|---|
| 4,701,717 | 10/1987 | Radermacher et al. | 330/149 |
| 4,870,371 | 9/1989 | Gottwald et al. | 330/149 |
| 4,967,164 | 10/1990 | Sari | 330/149 |
| 5,049,832 | 9/1991 | Cavers | 330/149 |

FOREIGN PATENT DOCUMENTS

| | | |
|---|---|---|
| 361608 | 4/1990 | European Pat. Off. |
| 3221911 | 11/1983 | Fed. Rep. of Germany |
| 2173074 | 10/1986 | United Kingdom |

OTHER PUBLICATIONS

Patent Abstracts of Japan, vol. 7, No. 208, (E-198) (1353), Sep. 14, 1983; & JP-A-58105658 (Nippon Denki) Jun. 23, 1983.

Primary Examiner—Eugene R. Laroche
Assistant Examiner—Tan Dinh
Attorney, Agent, or Firm—Oblon, Spivak, McClelland, Maier & Neustadt

[57] ABSTRACT

A process for compensating nonlinearities in an amplifier circuit. An input signal s(t) is amplified to form an output signal y(t) using an amplifier circuit subject to nonlinearities. In accordance with the invention, a predistortion filter is connected upstream of the amplifier circuit. An aggregate signal

$$\dot{x}(t) = \frac{1}{k_0} \left( k_1 s(t) - \sum_{i=1}^{n} k_i x^i(t) \right)$$

is formed in said filter from the input signal s(t) and a predistorted signal x(t) fed back from the output of the predistortion filter, and integrated with respect to time. The predistorted signal x(t) is fed to the amplifier circuit subject to nonlinearities. In this case, the prescribed number n+1 of coefficients $k_0, \ldots, K_n$ is determined in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the output signal y(t) of the amplifier circuit.

10 Claims, 4 Drawing Sheets

PROCESS FOR COMPENSATING NONLINEARITIES IN AN AMPLIFIER CIRCUIT

BACKGROUND OF THE INVENTION

1. Field of the Invention

The invention relates to a process for compensating nonlinearities in an amplifier circuit, in which an input signal s(t) is amplified to form an output signal y(t) using a prescribed amplifier circuit (e.g. a power amplifier for audio signals) subject to nonlinearities.

2. Discussion of Background

Amplifier circuits, in particular sound amplifiers of high power, such as are used to modulate radio transmitters in the LW, MW and KW region, are normally subject to nonlinearities which are to be eliminated. The classic solution for linearizing the characteristic provides feedback of the output signal. The measure of this feedback depends on the characteristic of the amplifier in the state without feedback.

It is known from control engineering how in the case of linear distortions of a circuit the feedback is to be designed so as to produce a linear characteristic overall. Present day nonlinear amplification processes often exclude linear feedback for reasons of stability associated with control engineering. To be precise, if feedback is not properly thought through, the nonnegligible signal transmission delays can render the amplification process unstable.

SUMMARY OF THE INVENTION

Accordingly, the object of the invention is to provide a process of the type mentioned above which, particularly for audio signals, ensures linear amplification using modern high-power amplifiers, and is free from instabilities.

According to the invention, the solution consists in that in a process of the type mentioned at the beginning
a) a prescribed number n+1 of coefficients $k_0, \ldots, k_n$ of the amplifier circuit are determined in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the actual output signal y(t) of the amplifier circuit,
b) an aggregate signal $$\dot{x}(t) = \frac{1}{k_0}\left( k_1 s(t) - \sum_{i=1}^{n} k_i x^i(t) \right), \quad x(0) = s(0)$$

is formed in a predistortion filter from the input signal s(t) and a predistorted signal x(t) fed back from the output of the predistortion filter,
c) this aggregate signal is integrated with respect to time in an integrator to form a predistorted signal x(t), and
d) the predistorted signal x(t) is fed to the amplifier circuit subject to nonlinearities.

The core of the invention consists in that the characteristic of the amplifier circuit, which has a pronounced signal transmission delay and a nonlinear amplitude amplification, is identified in accordance with the model $$y(t) = k_0 \dot{x}(t) + \sum_{i=1}^{n} k_i x^i(t)$$

and in that the input signal s(t) is predistorted in accordance with this model (i.e. the coefficients $k_0, k_1, k_2, \ldots, k_n$) in an upstream predistortion filter such that a linearly amplified output signal $y(t) = k_1 s(t)$ is present at the output of the amplifier circuit. Thus, a compensation signal is generated such that the undesired signal components ($k_0, k_2, k_3, \ldots, k_n$) are eliminated overall.

Although the output signal y(t) is used to correct nonlinearities, this is not done in the sense of a classic feedback. This approach provides certain advantages due to the principle, but does not solve all the stability problems. Consequently, an important aspect of the invention is also to be seen in that use is made for the purposes of predistortion only of those approaches to the solution in the model which ensure stable operation. In other words, unstable solutions have been recognized in the invention and eliminated purposefully.

The basic idea of the invention can be implemented with equal success using either analog or digital circuit engineering. Whereas the path toward a solution formulated above corresponds rather (if not exclusively, in principle) to the analog implementation, the following is clearly adjusted to the digital formulation.

As above, the first step is to determine a prescribed number n+1 of coefficients $k_0, \ldots, k_n$ of the amplifier circuit in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the output signal y(t) of the amplifier circuit. However, the predistortion filter operates digitally, which means that if it is not already present in digital form (which in future will certainly largely be the case) the input signal s(t) is digitized, and then a compensation signal c(j) is obtained recursively from the digitized input signal s(j) in accordance with $$c(j + 1) = \frac{-[k_2 s^2(j) + k_3 s^3(j) + k_0(N + 1)\{s(j) - s(j-1)\}/2\pi]}{k_1 + 2k_2 s(j) + 3k_3 s^2(j)}$$

$$\frac{[k_2 c^2(j) + k_3 c^3(j) + k_0(N + 1)\{c(j) - c(j-1)\}/2\pi]}{k_1 + 2k_2 s(j) + 3k_3 s^2(j)}$$

This compensation signal is added to the input signal s(t). The resulting signal x(t) is fed in analog (or digital) form to the amplifier circuit subject to nonlinearities.

The advantages of the digital solution over the analog solution are known, and come to bear here as well (no drift problems, simple and flexible implementation on the basis of programmability, etc.).

The determination of the coefficients $k_0, k_1, k_2, \ldots, k_n$ can be undertaken either with the aid of special test signals from time to time or continuously on the basis of, for example, the traversing audio signal. It is clear that a central importance attaches to said determination, since it is finally the case, after all, that the linearity of the amplification can only be as good as the estimation of the coefficients used for the predistortion.

According to a preferred embodiment of the invention, for the purpose of determining the prescribed number $n+1$ of coefficients $k_0, \ldots, k_n$ a) an estimated signal $$\hat{u}(t) = k_0 \dot{x}(t) + \sum_{i=1}^{n} k_i x^i(t)$$

is calculated in an identification processor from the predistorted signal x(t) generated by the predistortion filter in accordance with the model of the amplifier circuit, b) an error signal e(t) is formed from the difference between this estimated signal $\hat{u}(t)$ and the output signal y(t) of the amplifier circuit, and c) the coefficients $k_0, \ldots, k_n$ are determined from the predistorted signal x(t) and the error signal e(t) in accordance with the following rules:

$$\dot{k}_0 = \frac{1}{T\beta_0} \int_0^T e(t)\{\int x(t)dt\}dt$$

$$\dot{k}_i = \frac{1}{T\beta_i} \int_0^T e(t)x^i(t)dt, \ i = 1 \ldots n.$$

For the digital implementation, the coefficients $k = [k_0, k_1, \ldots, k_n]^T$ are determined in an identification processor from the predistorted signal x(t) generated by the predistortion filter and the output signal y(t) of the amplifier circuit in accordance with $$k = G^{-1}r.$$

The definition of these variables follows from the explanations below. It is obvious that this solution is advantageous particularly in conjunction with the digital predistortion.

Another path is taken by the identification process described below, in which a) the predistorted signal x(t) generated by the predistortion filter and the output signal y(t) of the amplifier circuit are each submitted to a fast Fourier transformation, and b) the coefficients $k = [k_0, k_1, \ldots, k_n]^T$ are determined in an identification processor from the Fourier-transformed signals in accordance with $$k = (m^T M)^{-1} M^T Y$$

(detailed definitions will follow later).

A compensation signal c(j) with good convergence (stability) can be determined from the digitized input signal s(j) in accordance with $$c(j+1) =$$

$$\alpha \left[ c(j) - \{s(j+1) - s(j)\} - \frac{k_2}{k_0} \frac{2\pi}{N} \{c(j) + s(j)\}^2 - \frac{k_3}{k_0} \frac{2\pi}{N} \{c(j) + s(j)\}^3 \right]$$

-continued $$\alpha = \exp\left(-\frac{k_1 2\pi}{k_0 N}\right) < 1$$

Since a high computing speed is required in processing audio signals in radio engineering, a certain importance attaches to the efficient calculation of the variables according to the invention. The components of the vectors r(j), k(j) and of the matrices G(j) are advantageously updated in accordance with the following scheme:

$$r(j+1) = \delta(j) + \delta r(j+1)$$

$$G(j+1) = G(j) + \delta G(j+1)$$

$$k(j+1) = k(j) + \delta k(j+1)$$

A good compensation for the practice of transmitter engineering is produced with $n+1=4$ coefficients $k_0, \ldots, k_3$. A good linearity of the amplification is achieved in this way with an acceptable computational outlay.

It is particularly advantageous when the identification of the coefficients $k_i$, $i = 0 \ldots n$, is carried out in prescribed time intervals during the operation of the amplifier circuit. An adaptive predistortion is then possible which also continuously takes account of the power amplifier characteristic which varies during operation.

The person skilled in the art can readily derive a suitable circuit arrangement from the process according to the invention. The invention thus also comprises an arrangement for the linear amplification of signals, in particular for the power amplification of audio signals, having an amplifier circuit subject to nonlinearities for generating signals of high power, in which arrangement a) means are provided in order to determine a prescribed number $n+1$ of coefficients $k_0, \ldots, k_n$ of the amplifier circuit in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the output signal y(t) of the amplifier circuit, b) a predistortion filter is provided before the amplifier circuit, in which filter an aggregate signal $$\dot{x}(t) = \frac{1}{k_0}\left(k_1 s(t) - \sum_{i=1}^{n} k_i x^i(t)\right)$$

is formed from the input signal s(t) of the arrangement and a predistorted signal x(t) fed back from the output of the predistortion filter, this aggregate signal is integrated with respect to time in an integrator to form a predistorted signal x(t), and c) the signal x(t) predistorted by the predistortion filter is fed to the amplifier circuit subject to nonlinearities.

Overall, the user of the circuit according to the invention thus has at his disposal a high-power amplifier with a linear characteristic. Specifically, the preferably digital predistortion filter can readily be accommodated in the housing of the power amplifier in question.

Further advantageous embodiments follow from the totality of the dependent patent claims.

BRIEF DESCRIPTION OF THE DRAWINGS

A more complete appreciation of the invention and many of the attendant advantages thereof will be readily obtained as the same becomes better understood by reference to the following detailed description when considered in connection with exemplary embodiments and the accompanying drawings, wherein.

The designations used in the drawings are listed in summary together with their meanings in the list of designations.

DESCRIPTION OF THE PREFERRED EMBODIMENTS

Figure 1:
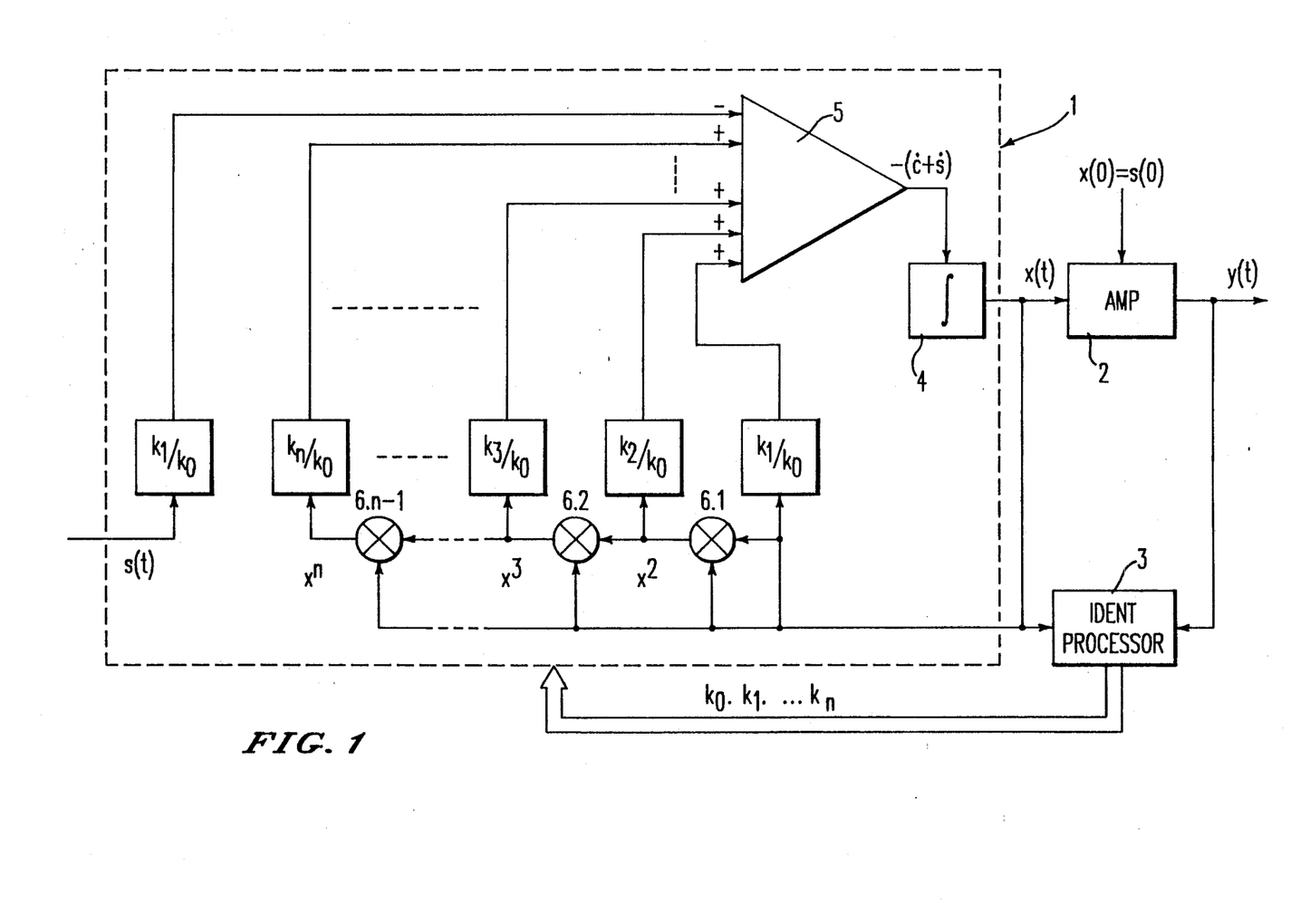
FIG. 1 shows a block diagram of a predistortion filter for linearizing the amplification of a nonlinear amplifier circuit.

Referring now to the drawings, wherein like reference numerals designate identical or corresponding parts throughout the several views, FIG. 1 shows a block diagram of a predistortion filter 1 for linearizing the amplification of a nonlinear amplifier circuit 2. An input signal s(t), for example an audio signal, is to be linearly amplified to form an output signal y(t):

$$y(t) = k_1 s(t) \tag{I}$$

The prescribed amplifier circuit 2, for example a high-power amplifier, has a nonlinear characteristic per se. It typically displays a pronounced signal transmission delay and a nonlinear amplitude amplification. As a result, intermodulations would occur if the input signal s(t) were to be directly amplified without any sort of precautions.

In accordance with the invention, the input signal s(t) is therefore first fed to a predistortion filter 1, which carries out a suitable predistortion. The predistorted signal x(t) is then brought up to the required power level by the amplifier circuit 2. The parameters of the predistortion are obtained with the aid of an identification processor from the input signal and output signal of the amplifier circuit 2.

The type of predistortion represents the essential feature of the invention. It is to be explained in detail below taking account of the mathematical background.

The mathematical model, on which the invention is based, of the amplifier circuit 2 is as follows:

$$y(t) = k_0 \dot{x}(t) + \sum_{i=1}^{n} k_i x^i(t), \quad \dot{x}(t) = \frac{d}{dt} x(t) \tag{II}$$

$$x(t) = c(t) + s(t) \tag{III}$$

Thus, a compensation signal c(t) is added to the input signal s(t). The resulting predistorted signal x(t) is amplified to form an output signal y(t) in accordance with a prescribed number n+1 of coefficients $k_0, \ldots, k_n$.

(The "." represents the time derivation in conventional fashion.)

The delay time of the amplifier circuit 2 is identified by the coefficient $k_0$. For the rest, the coefficients $k_i$, $i = 0 \ldots n$, are slowly varying parameters of the power amplifier which are determined sporadically or continuously.

The coefficients $k_i$ are to be determined in accordance with the invention so that for a given input signal x(t) of the amplifier circuit 2 the output signal determined in accordance with the model is essentially identical with the output signal y(t) of the amplifier circuit 2. Any possible deviations should optimally be solely the result of imperfections of the model.

In the present exemplary embodiment, the determination of the coefficients $k_i$ is undertaken by an identification processor 3. It uses for this purpose the predistorted signal x(t) present directly at the input of the amplifier circuit 2 and the output signal y(t). It feeds back to the predistortion filter 1 the n+1 coefficients $k_i$, $i = 0 \ldots n$, which it calculates therefrom.

Predistortion Filter

The predistortion filter 1 is based on the principle of reducing the error signal e(t)

$$e(t) = y(t) - k_1 s(t) \tag{IV}$$

to zero. It is then the case, specifically, that the output signal corresponds exactly to the linearly amplified input signal.

For this purpose, an aggregate signal $$\dot{x}(t) = \frac{1}{k_0}\left( k_1 s(t) - \sum_{i=1}^{n} k_i x^i(t) \right), \quad x(0) = s(0) \tag{V}$$

is formed from the input signal s(t) and the predistorted signal x(t) fed back from the output of the predistortion filter 1. This aggregate signal is integrated with respect to time in an integrator 4 to form the desired predistorted signal x(t).

FIG. 1 shows a possible device for carrying out the predistortion. The input signal s(t) is fed, weighted with a factor $k_1/k_0$, to a summer 5. Powers $x^i(t)$, $i = 2 \ldots n$, are formed from the predistorted signal x(t), for example with the aid of n-1 multipliers $6.1, \ldots, 6.n-1$, and are likewise fed—respectively weighted with a factor $k_i/k_0$, $i = 1 \ldots n$—to the summer 5. The latter forms the desired aggregate signal.

The individual components of this circuit arrangement are known. It is a simple possibility for the person skilled in the art to implement a device for carrying out the predistortion according to the invention (formula (II)+(IV)). The invention is therefore also not limited to the represented embodiment of the circuit.

The compensation signal c(t) can advantageously be determined in a digital way. For this purpose, the input signal s(t) must be present in digitized form, i.e. as a sequence of values s(j), $j = 0, 1, \ldots N$. In accordance with the invention, c(j) follows from the recursive formula $$c(j+1) = \tag{VI}$$

$$\frac{-[k_2 s^2(j) + k_3 s^3(j) + k_0(N+1)\{s(j) - s(j-1)\}/2\pi]}{k_1 + 2k_2 s(j) + 3k_3 s^2(j)}$$

-continued $$\frac{[k_2 c^2(j) + k_3 c^3(j) + k_0(N+1)\{c(j) - c(j-1)\}/2\pi]}{k_1 + 2k_2 s(j) + 3k_3 s^2(j)}$$

N denotes the number of samples per computational cycle (j→j+1).

This compensation signal is added (on an analog or digital plane) to the input signal in the sense of the formula (III). The resulting predistorted signal x(t) is then fed to the amplifier circuit subject to nonlinearities.

A compensation signal c(j) with good convergence (stability) can be determined from the digitized input signal s(j) in accordance with $$c(j+1) = \quad \text{(VII)}$$

$$\alpha \left[ c(j) - \{s(j+1) - s(j)\} - \frac{k_2}{k_0} \frac{2\pi}{N} \{c(j) + s(j)\}^2 - \frac{k_2}{k_0} \frac{2\pi}{N} \{c(j) + s(j)\}^3 \right]$$

$$\alpha = \exp\left(-\frac{k_1 2\pi}{k_0 N}\right) < 1 \quad \text{(VIII)}$$

The stability is based on the fact that $\alpha < 1$.

Identification

In principle, the coefficients $k_i$, $i = 0 \ldots n$, can be determined once, for example when the amplifier is taken into service, and then used as constants for the predistortion. Preferably, however, the amplifier characteristic is continuously reidentified, so that an adaptive compensation of the nonlinearity finally results. The invention also provides a suitable identification process for this case in particular.

Figure 2:
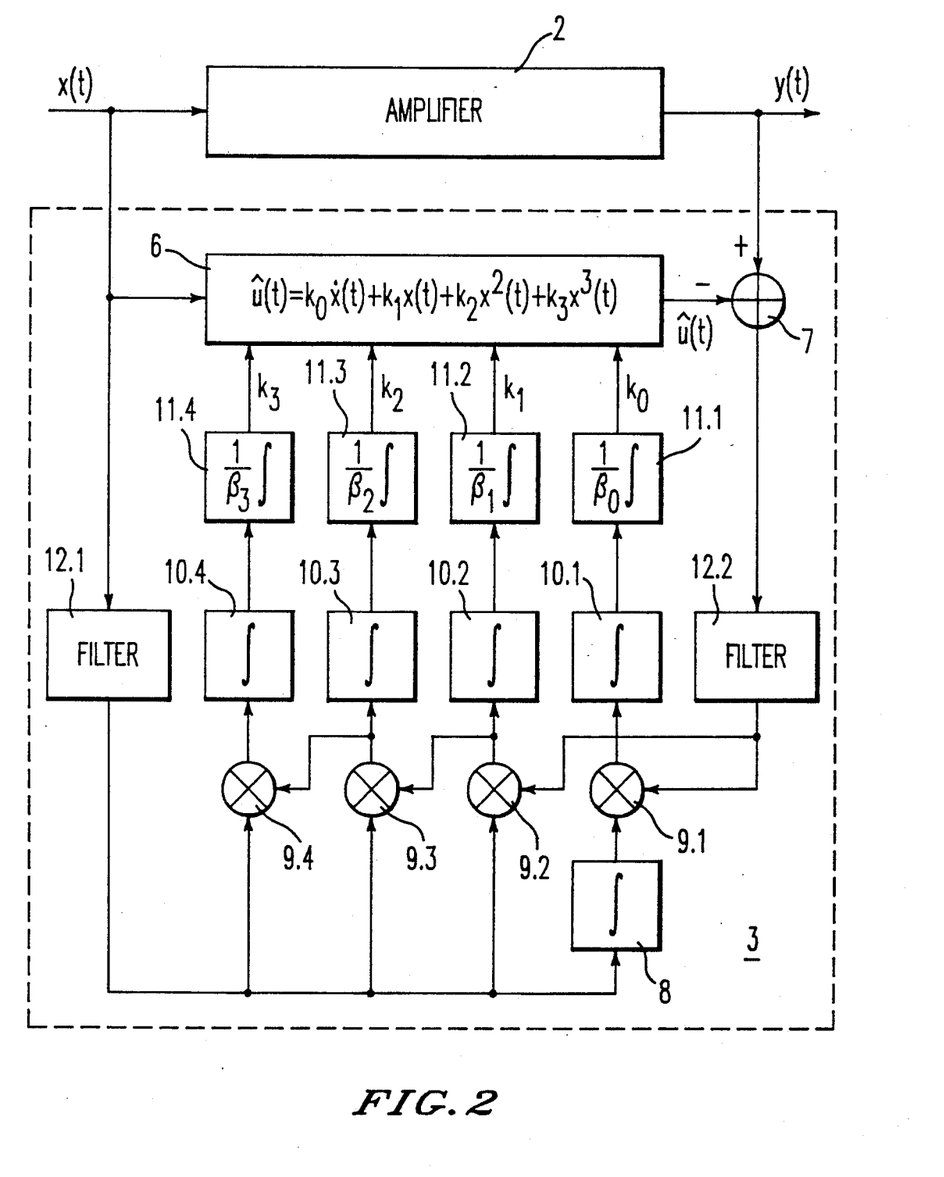
FIG. 2 shows a block diagram of an identification processor for determining the coefficients $k_0, \ldots, k_n$.

The principle of identification emerges from FIG. 2. The process operates recursively. In order to set it in train, initial values must be prescribed for the coefficients $k_i$, $i = 0 \ldots n$, to be determined. However, these values are not what really matters, since the coefficients $k_i$, $i = 0 \ldots n$, generally ((i.e. given fairly sensible preconditions, for example $|k_1| >> |k_i|$, $i \neq 1$, i.e. $i = 0, 2, 3, \ldots, n$) converge to the values sought after a few traverses.

A signal $$\hat{u}(t) = k_0 \dot{x}(t) + \sum_{i=1}^{n} k_i x^i(t) \quad \text{(IX)}$$

estimated in accordance with the model of the amplifier circuit is determined with the aid of the coefficients $k_i$, $i = 0 \ldots n$, known (or prescribed at the beginning) from the previous cycle of the identification traverse. Here, too, x(t) denotes the immediate input signal of the amplifier circuit, it being of no importance for the identification whether x(t) has been predistorted or not. This is so in the case of the adaptive compensation, but generally not so in the case of starting up the predistortion filter.

An error signal e(t)

$$e(t) = y(t) - \hat{u}(t) \quad \text{(X)}$$

is formed from the difference between this estimated signal û(t) and the output signal y(t) of the amplifier circuit 2. The coefficients $k_i$, $i = 0 \ldots n$, are formed from the immediate input signal x(t) and the error signal e(t) in accordance with the following rules:

$$k_0 = \frac{1}{\beta_0} \overline{\int e(t)\{\int x(t)dt\}dt} \quad \text{(XI)}$$

$$k_i = \frac{1}{\beta_i} \overline{\int e(t)x^i(t)dt}, \quad i = 1 \ldots n. \quad \text{(XII)}$$

The bar in the formulae denotes time averaging, in the known way.

The coefficients $k_i$, $i = 0 \ldots n$, thus calculated are used for the next computational cycle for evaluating the formula (IX). They can also be transmitted to the predistortion filter. This will certainly be so in the case of the adaptive compensation. In the case of only sporadic determination of the coefficients $k_i$, $i = 0 \ldots n$, there is a wait, for example, until the identification process has converged.

FIG. 2 shows a possible device for carrying out the identification for $n + 1 = 4$ coefficients. Although the representation is rather modeled on analog engineering, it does apply equally to a digital implementation.

A model computer 6 determines the estimated signal û(t) in accordance with formula (IX). Thereafter, the error signal e(t) i formed in accordance with formula (X) using a subtractor 7 and filtered in a filter 12.2.

Provided for each coefficient $k_i$, $i = 0 \ldots 3$, is a signal path which has in series in each case a multiplier 9.1, ..., 9.4, a first integrator 10.1, ..., 10.4 and a second integrator 11.1, ..., 11.4 weighted with a factor $1/\beta_i$, $i = 0 \ldots 3$. An additional integrator 8 is connected upstream of the path provided for calculating $k_0$. The integrators essentially generate a time mean. The integration period should be longer in each case than one period of the smallest frequency occurring in the audio signal ($T f_{min} >> 1$: It holds for audio signals, for example, that typically $f_{min} = 50$ Hz→for example T=0.1 s).

The signal x(t) is filtered in a filter 12.1 and fed to each signal path. The multiplier 9.1 forms the product of e(t) and the time mean of x(t) in order to calculate $k_0$. The products $x^i(t)e(t)$, $i = 1 \ldots 3$, are calculated for the remaining coefficients $k_i$, $i = 1 \ldots 3$, with the aid of the multipliers 9.2, ..., 9.4. The said products are averaged by the respective following integrators 10.1 and 11.1 to 10.4 and 11.4.

The weightings $1/\beta_i$ follow in an optimum fashion from the following relationships:

$$\beta_0 \dot{k}_0 = \frac{1}{T} \int_0^T e(t)\{\int x(t)dt\}dt = \overline{e(t)\{\int x(t)dt\}} \quad \text{(XIII)}$$

$$\beta_i \dot{k}_i = \frac{1}{T} \int_0^T e(t)x^i(t)dt = \overline{e(t)x^i(t)}, \quad i = 1 \ldots 3 \quad \text{(XIV)}$$

Although the identification does converge as before if the weightings $1/\beta_i$ are not defined in accordance with the formulae, it no longer does so in an optimally fast fashion, however.

The two filters 12.1 and 12.2 allow only a narrow frequency band to pass (extraction of "one" frequency).

Figure 3:
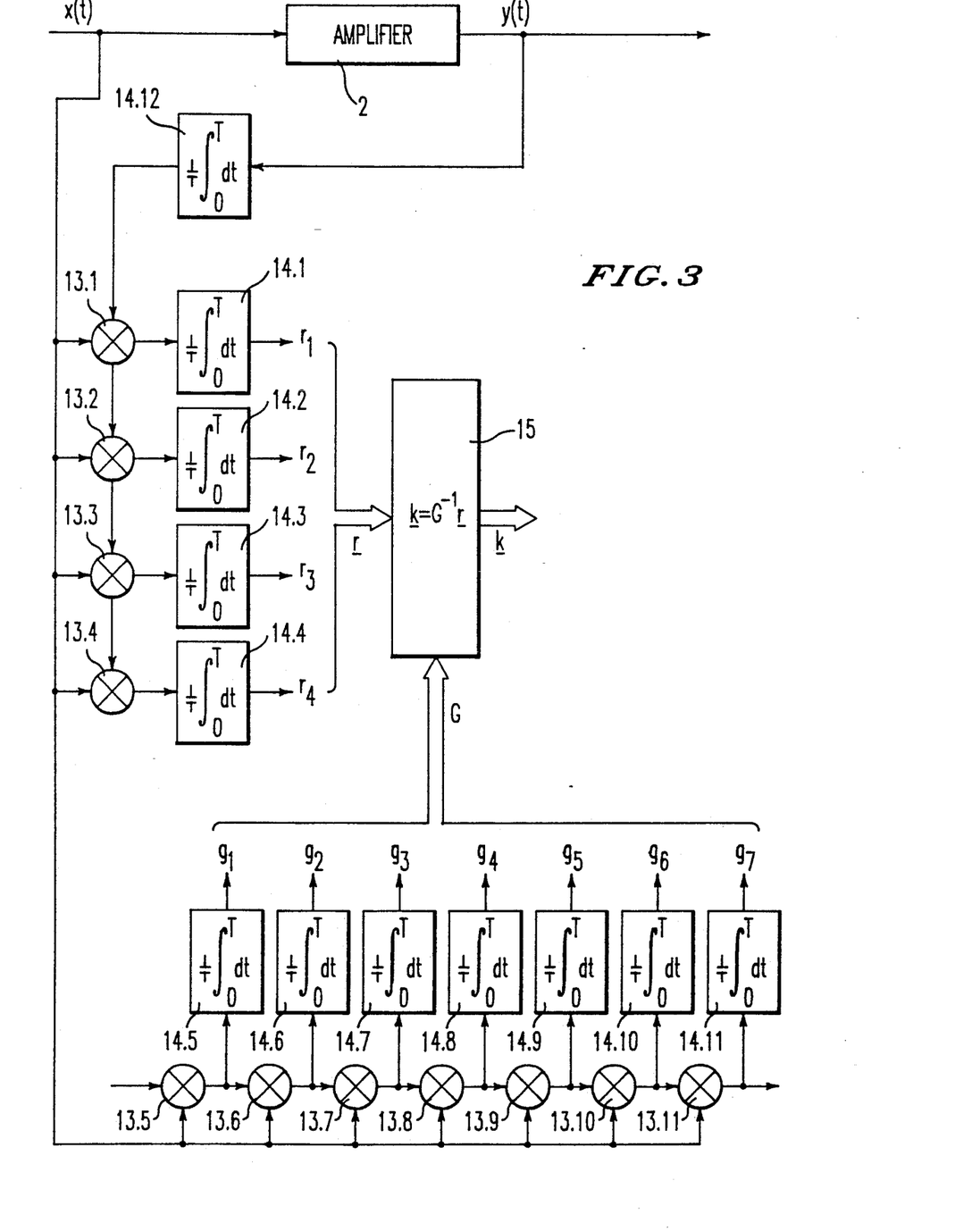
FIG. 3 shows a block diagram for carrying out the digital identification.

FIG. 3 shows a block diagram of an identification processor which corresponds to a digital implementation of the invention. The basic process functions as follows.

Various coefficients of an $(n+1)(n+1)$ matrix are formed from the output signal y(t) with the aid of multipliers 13.1-13.11 and integrators $2n-1:14.1-14.12$ $$G=[G_{ik}], i,k=1\ldots n+1 \quad \text{(XV)}$$

$$G_{ik} = g_{i+k-1} = \frac{1}{T}\int_0^T x^{i+k}(t)dt, \quad i,k=1\ldots n+1 \quad \text{(XVI)}$$

In addition, an $(n+1)$-dimensional vector r is determined from the immediate input signal x(t) and the output signal y(t) of the amplifier circuit 2 (the superscript "T" denotes transposition here):

$$r=[r_1, r_2, \ldots, r_{n+1}]^T \quad \text{(XVII)}$$

$$r_i = \frac{1}{T}\int_0^T x^i(t)\{\int y(t)dt\}dt, \quad i=1\ldots n+1 \quad \text{(XVIII)}$$

The coefficients, $K_i$, $i=0\ldots n$, then follow as a solution of the equation $$k=G^{-1}r \quad \text{(XIX)}$$

$$k=[k_0, k_1, \ldots, k_n]^T \quad \text{(XX)}$$

Since a high computing speed is required in processing audio signals in radio engineering, a certain importance attaches to the efficient calculation of the variables according to the invention. The components of the vectors r(j), k(j) and the matrices G(j) are advantageously updated in accordance with the following scheme:

$$r(j+1)=r(j)+\delta r(j+1) \quad \text{(XXI)}$$

$$G(j+1)=G(j)+\delta G(j+1) \quad \text{(XXII)}$$

$$k(j+1)=k(j)+\delta k(j+1) \quad \text{(XXIII)}$$

The components of these three vectors are thus stored from one traverse to the next. The index j is used here additionally to enumerate the traverse of the identification process:

$$r(j+1) = \frac{1}{T}\int_{jT}^{(j+1)T} x^i(t)y(t)dt, \quad i=1\ldots n+1 \quad \text{(XXIV)}$$

The same holds for the other variables.

A good approximation in the calculation of the coefficient vector k(j) using calculator 15 is:

$$k(j+1)=G^{-1}(j)[\delta r(j+1)-\delta G(j+1)k(j)] \quad \text{(XXV)}$$

or $$k(j+1)=G^{-1}(j)r(j)+\delta k(j+1), \ i>1 \quad \text{(XXVI)}$$

FFT Identification

Another path is taken in the embodiment of the identification process described below. The essential difference consists in that the identification of the coefficients $k_i$, $i=0\ldots n$, is performed in Fourier space. As a matter of principle, this process is not based on recursion.

Figure 4:
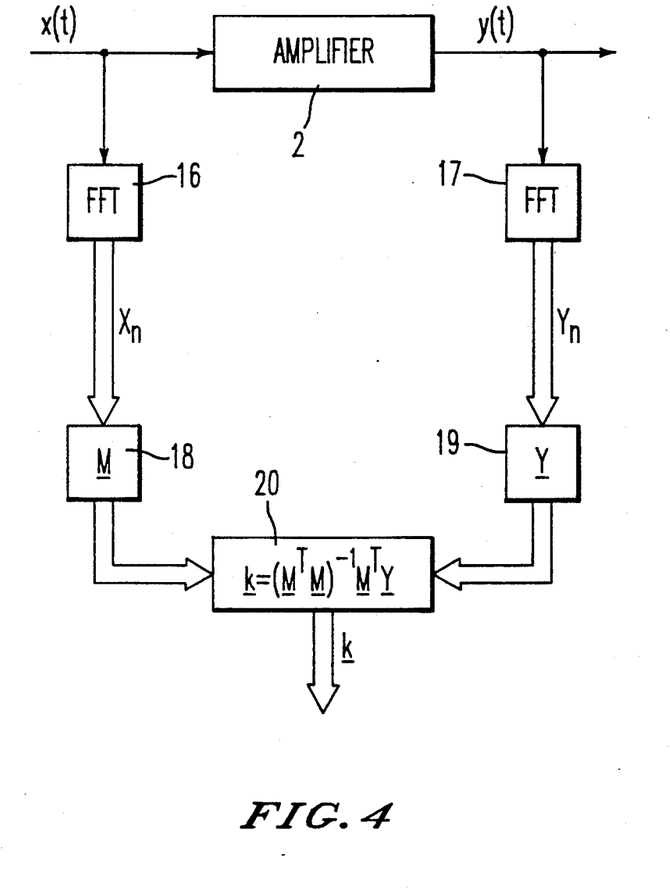
FIG. 4 shows a block diagram for carrying out the identification using fast Fourier transformation.

FIG. 4 shows a computational example for $n+1=4$ coefficients $k_i$, $i=0\ldots 3$. The first step is to submit the immediate input signal x(t) (and its powers $x^i(t)$) and the output signal y(t) of the amplifier circuit to a fast Fourier transformation (abbreviated to FFT) in FFT transformers 16 and 17:

$$T[x(t)] = \sum_{m=-N}^{N} X_m e^{jmwt} \quad \text{(XXVII)}$$

$$T[x^2(t)] = \sum_{m=-N}^{N} A_m e^{jmwt} \quad \text{(XXVIII)}$$

$$T[x^3(t)] = \sum_{m=-N}^{N} B_m e^{jmwt} \quad \text{(XXVIX)}$$

$$A_m = \sum_{i=-N}^{N} X_m X_{m-i} \quad \text{(XXX)}$$

$$B_m = \sum_{i=1N}^{N} A_m X_{m-i} \quad \text{(XXXI)}$$

$$T[y(t)] = \sum_{m=-N}^{N} Y_m e^{jmwt} \quad \text{(XXXII)}$$

w=Fundamental frequency of the FFT
N=Number of frequencies in the FFT
j=Complex unit ($e^{j\pi}=-1$)
T[.] symbolizes the FFT series which comprises at most Nw frequencies. Thus, all frequencies higher than Nw are for example omitted in $T[x^3(t)]$. It should be noted that $X_m$, $A_m$, $B_m$ and $Y_m$ are generally coefficients with complex values.

The application of the FFT to formula (II)—n being set equal to 3—and the coefficient comparison lead to the following equation:

$$Y_m=(-jmwX_m)k_0+X_m k_1+A_m k_2+B_m k_3, \ m=0\ldots N \quad \text{XXXIII)}$$

In accordance with the invention, this equation is now evaluated. The outputs of FFT transformers 16 and 17 are fed to matrix determining devices 18 and 19, respectively. In order to obtain a simple representation of the solution, vector notation is introduced. In detail, the following variables are defined:

$$Y=[Y_1, Y_2]^T \quad \text{(XXXIV)}$$

$$Y_i=[Y_{i0}, Y_{i1}, \ldots, Y_{iN}]^T, i=1, 2 \quad \text{(XXXV)}$$

$$Y_{1m}=-mwX_{2m}k_0+X_{1m}k_1+A_{1m}k_2+B_{1m}k_3, \ m=0\ldots N \quad \text{(XXXVI)}$$

$$Y_{2m}=mwX_{1m}k_0+X_{2m}k_1+A_{2m}k_2+B_{2m}k_3, \ m=0\ldots N \quad \text{(XXXVII)}$$

$$Y_m=Y_{1m}+jY_{2m}, \ m=0\ldots N \quad \text{(XXXVIII)}$$

$$X_m=X_{1m}+jX_{2m}, \ m=0\ldots N \quad \text{(XXXIX)}$$

$$A_m=A_{1m}+jA_{2m}, \ m=0\ldots N \quad \text{(XL)}$$

$$B_m=B_{1m}+jB_{2m}, \ m=0\ldots N \quad \text{(XLI)}$$

The variables $Y_{1m}$, $Y_{2m}$, $X_{1m}$, $X_{2m}$, $A_{1m}$, $A_{2m}$, $B_{1m}$ and $B_{2m}$ ($m=0\ldots N$) are thus ordinary real numbers. Using the following matrix definitions:

$$M = [M_1, M_2]^T \quad \text{(XLII)}$$

$$M_1 = \begin{matrix} 0 & X_{10} & A_{10} & B_{10} \\ -wX_{21} & X_{11} & A_{11} & B_{11} \\ \cdot & \cdot & \cdot & \cdot \\ \cdot & \cdot & \cdot & \cdot \\ \cdot & \cdot & \cdot & \cdot \\ -wX_{N1} & X_{1N} & A_{1N} & B_{1N} \end{matrix} \quad \text{(XLIII)}$$

$$M_2 = \begin{matrix} 0 & X_{20} & A_{20} & B_{20} \\ wX_{11} & X_{21} & A_{21} & B_{21} \\ \cdot & \cdot & \cdot & \cdot \\ \cdot & \cdot & \cdot & \cdot \\ \cdot & \cdot & \cdot & \cdot \\ wX_{N1} & X_{2N} & A_{2N} & B_{2N} \end{matrix} \quad \text{(XLIII)}$$

the solution according to the equation can be reduced to the simple formula $$k = (M^T M)^{-1} M^T Y \quad \text{(XLV)}$$

$$k = [k_0, k_1, k_2, k_3]^T \quad \text{(XLVI)}$$

and k is determined in device 20.

The identification process thus comprises the following steps:
1. Determination of the coefficients $Y_{1m}$, $Y_{2m}$, $X_{1m}$, $X_{2m}$, $A_{1m}$, $A_{2m}$, $B_{1m}$ and $B_{2m}$ (m=0...N) with the aid of FFT.
2. Formation from these coefficients of the matrix M or $(M^T M)^{-1}$.
3. Calculation of the coefficients $k_i$, i=0...3, from the equation (XLV).

Although the exemplary embodiment just explained relates to n+1=4, it is clear to the person skilled in the art, nevertheless, how he is to construct the process according to the invention for other n. For example, for n+1=5 further coefficients $C_m$ would need to be formed in accordance with $$C_m = \sum_{i=-N}^{N} B_m^- X_{m-i} \quad \text{(XLVII)}$$

The matrix M is enlarged correspondingly.

It may be stated in conclusion that the invention permits the linearization of nonlinear characteristics such as are required, in particular, in high-power amplifiers in communications engineering.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for compensating nonlinearities in an amplifier circuit, in which an input audio signal s(t) is amplified to form an output audio signal y(t) using a prescribed amplifier circuit subject to nonlinearities, comprising:

determining a prescribed number n+1 of coefficients $k_0, \ldots, k_n$ of the amplifier circuit in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the actual output signal y(t) of the amplifier circuit, producing an aggregate signal $$\dot{x}(t) = \frac{1}{k_0} \left\{ k_1 s(t) - \sum_{i=1}^{n} k_i x^i(t) \right\}, x(0) = s(0)$$

in a predistortion filter from the input signal s(t), integrating the aggregate signal with respect to time in an integrator to form a predistorted signal x(t), and feeding back a predistorted signal x(t) fed back to the predistortion filter, and feeding a predistorted signal from the output of the predistortion filter x(t) to the amplifier circuit subject to nonlinearities.

2. A process for compensating nonlinearities in an amplifier circuit, in which an input audio signal s(t) is amplified to form an output audio signal y(t) using an amplifier circuit subject to nonlinearities, comprising:

determining a prescribed number n+1 of coefficients $k_0, \ldots, k_n$ of the amplifier circuit in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the actual output signal y(t) of the amplifier circuit, obtaining a compensation signal c(j) in a predistortion filter from the digitized input signal s(j) in accordance with $$c(j+1) = \frac{-[k_2 s^2(j) + k_3 s^3(j) + k_0(N+1)\{s(j) - s(j-1)\}/2\pi]}{k_1 + 2k_2 s(j) + 3k_3 s^2(j)}$$

$$\frac{[k_2 c^2(j) + k_3 c^3(j) + k_0(N+1)\{c(j) - c(j-1)\}/2\pi]}{k_1 + 2k_2 s(j) + 3k_3 s^2(j)}$$

adding the compensation signal to the input signal, and feeding the resulting signal x(t) to the amplifier circuit subject to nonlinearities.

3. The process as claimed in claim 1 or 2, wherein for the purpose of determining the prescribed number n+1 of coefficients $k_0, \ldots, k_n$ determining an estimated signal $$\hat{u}(t) = k_0 \dot{x}(t) + \sum_{i=1}^{n} k_i x^i(t)$$

in an identification processor from the immediate input signal x(t) of the nonlinear amplifier circuit in accordance with the model of the amplifier circuit, forming an error signal e(t) from the difference between this estimated signal û(t) and the actual output signal y(t) of the amplifier circuit, and forming the coefficients $k_0, \ldots, k_n$ are formed from the said input signal x(t) and the error signal e(t) in accordance with the following rules:

$$\dot{k}_0 = \frac{1}{T\beta_0} \int_0^T e(t)\{\int x(t)dt\}dt$$

$$\dot{k}_i = \frac{1}{T\beta_i} \int_0^T e(t)x^i(t)dt, \ i = 1 \ldots n.$$

4. The process as claimed in claim 1 or 2, wherein the coefficients $k=[k_0, k_1, \ldots, k_n]^T$ are determined in an identification processor from the immediate input signal x(t) of the nonlinear amplifier circuit and the actual output signal y(t) of the amplifier circuit in accordance with $$k=G^{-1}r.$$

5. The process as claimed in claim 1 or 2, wherein the immediate input signal x(t) of the nonlinear amplifier circuit and the output signal y(t) are each submitted to a fast Fourier transformation, and the coefficients $k=[k_0, k_1, \ldots, k_n]^T$ are determined in an identification processor from the Fourier-transformed signals in accordance with $$k=(M^TM)^{-1}M^TY.$$

6. The process as claimed in claim 2, wherein by contrast with claim 2 the compensation signal c(j) is determined from the digitized input signal s(j) in accordance with $$c(j + 1) =$$

$$\alpha \left[ c(j) - \{s(j + 1) - s(j)\} - \frac{k_2}{k_0} \ \frac{2\pi}{N} \ \{c(j) + s(j)\}^2 - \frac{k_2}{k_0} \ \frac{2\pi}{N} \ \{c(j) + s(j)\}^3 \right]$$

-continued $$\alpha = \exp\left(-\frac{k_1 \ 2\pi}{k_0 \ N}\right) < 1$$

7. The process as claimed in claim 4, wherein the components of the vectors r(j), k(j) and of the matrices G(j) are updated in accordance with $$r(j+1)=r(j)+\delta r(j+1)$$

$$G(j+1)=G(j)+\delta G(j+1)$$

$$k(j+1)=k(j)+\delta k(j+1).$$

8. The process as claimed in claim 1 or 2, wherein the predistortion filter operates with $n+1=4$ coefficients $k_0, \ldots, k_3$.

9. The process as claimed in claim 1, wherein the coefficients $k_0, \ldots, k_n$ are continuously redetermined, resulting in adaptive compensation of the nonlinearities.

10. An arrangement for the linear amplification of signals, in particular for the power amplification of audio signals, comprising an amplifier circuit subject to nonlinearities for generating signals of high power, wherein first means are provided in order for determining a prescribed number $n+1$ of coefficients $k_0, \ldots, k_n$ of the amplifier circuit in accordance with the model $$y(t) = k_0 \dot{x}(t) + \sum_{i=1}^{n} k_i x^i(t)$$

so that for a given input signal x(t) of the amplifier circuit the output signal determined in accordance with the model is essentially identical with the output signal y(t) of the amplifier circuit, a predistortion filter is provided before the amplifier circuit, in which filter an aggregate signal $$\dot{x}(t) = \frac{1}{k_0} \left( k_1 s(t) - \sum_{i=1}^{n} k_i x^i(t) \right), x(0) = s(0)$$

is formed from the input signal s(t) of the arrangement and a predistorted signal x(t) fed back from the output of the predistortion filter, an integrator is provided for integrating with respect to time the aggregate signal to form a predistorted signal x(t), and the signal x(t) predistorted by the predistortion filter is fed to the amplifier circuit subject to nonlinearities.

* * * * *